United States Patent
Sassolini et al.

(10) Patent No.: US 6,924,166 B2
(45) Date of Patent: Aug. 2, 2005

(54) PROCESS FOR SEALING DEVICES INCORPORATING MICROSTRUCTURES

(75) Inventors: Simone Sassolini, Sansepolcro (IT); Marco Del Sarto, Massa (IT); Giovanni Frezza, San Donato Milanese (IT); Lorenzo Baldo, Bareggio (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 77 days.

(21) Appl. No.: 10/293,980

(22) Filed: Nov. 12, 2002

(65) Prior Publication Data

US 2003/0143773 A1 Jul. 31, 2003

(30) Foreign Application Priority Data

Nov. 16, 2001 (EP) ............................................. 01830712

(51) Int. Cl.$^7$ ............................................... H01L 21/00
(52) U.S. Cl. ............................. 438/51; 438/50; 438/52; 438/106; 438/112; 438/113; 438/126; 438/127; 257/787; 257/788; 257/789; 257/795; 257/414; 257/417; 360/294.6; 360/244; 360/245; 360/294.3
(58) Field of Search ...................... 438/51, 55, 25–28, 438/64, 68, 73, 106, 112–114, 126–127, 780–781, 902, 50, 52; 257/787–796, 414, 417; 360/294.6, 244, 244.1–244.9, 245–245.7, 294.3

(56) References Cited

U.S. PATENT DOCUMENTS

| | | | | |
|---|---|---|---|---|
| 4,906,586 A | * | 3/1990 | Blackburn | 438/53 |
| 5,304,419 A | | 4/1994 | Shores | 428/355 |
| 5,428,259 A | * | 6/1995 | Suzuki | 310/309 |
| 6,052,287 A | * | 4/2000 | Palmer et al. | 361/767 |
| 6,096,656 A | | 8/2000 | Matzke et al. | 438/702 |
| 6,198,145 B1 | * | 3/2001 | Ferrari et al. | 257/415 |
| 6,222,704 B1 | * | 4/2001 | Aoyagi et al. | 360/244.9 |
| 6,233,121 B1 | * | 5/2001 | Pan | 360/245.7 |
| 6,262,464 B1 | | 7/2001 | Chan et al. | 257/414 |
| 6,396,174 B1 | * | 5/2002 | Vigna et al. | 310/40 MM |
| 6,404,599 B1 | * | 6/2002 | Vigna | 360/294.1 |

(Continued)

FOREIGN PATENT DOCUMENTS

| | | |
|---|---|---|
| DE | 100 05 555 A1 | 8/2001 |
| EP | 0 660 118 A1 | 6/1995 |
| EP | 0 955 629 A1 | 11/1999 |
| EP | 1 122 721 A1 | 8/2001 |
| WO | WO 98/32616 | 7/1998 |

OTHER PUBLICATIONS

"Lost data: How a Little Dirt Can Do a Lot of Damage," Retrieved Jun. 8, 2001, from http://ds.pennnet.com/Articles/Article_Display.cfm?Section=Archives&Subsection=Display&ARTICLE_ID=38426&KEYQWORD=dirt, *DATA Storage,* Mar. 1999.

"HIPEC® Q3–6646 Semiconductor Protective Coating," Dow Corning Corporation, May 1, 1998.

(Continued)

*Primary Examiner*—Matthew Smith
*Assistant Examiner*—Victor V. Yevsikov
(74) *Attorney, Agent, or Firm*—Lisa K. Jorgenson; Harold H. Bennett, II; Seed IP Law Group PLLC

(57) ABSTRACT

A process for the fabrication of devices that integrate protected microstructures, comprising the following steps: forming, in a body of semiconductor material, at least one microstructure having at least one first portion and one second portion which are relatively mobile with respect to one another and are separated from one another by at least one gap region, which is accessible through a face of the body; and sealing the gap. The sealing step includes depositing on the face of the body a layer of protective material, in such a way as to close the gap region, the protective layer being such as to enable relative motion between the first portion and the second portion of the microstructure.

42 Claims, 5 Drawing Sheets

U.S. PATENT DOCUMENTS

| | | | |
|---|---|---|---|
| 6,433,390 B1 * | 8/2002 | Hara | 257/347 |
| 6,437,412 B1 * | 8/2002 | Higuchi et al. | 257/416 |
| 6,446,326 B1 * | 9/2002 | Mastromatteo et al. | 29/603.04 |
| 6,458,616 B2 * | 10/2002 | Ferrari et al. | 438/50 |
| 6,483,671 B2 * | 11/2002 | Vigna et al. | 360/294.5 |
| 6,496,997 B1 * | 12/2002 | Murari et al. | 15/1.51 |
| 6,498,053 B2 * | 12/2002 | Mastromatteo et al. | 438/107 |
| 6,501,623 B1 * | 12/2002 | Sassolini et al. | 360/245.3 |
| 6,504,253 B2 * | 1/2003 | Mastromatteo et al. | 257/758 |
| 6,555,602 B1 * | 4/2003 | Harada et al. | 523/466 |
| 6,587,312 B2 * | 7/2003 | Murari et al. | 360/294.3 |
| 6,590,747 B1 * | 7/2003 | Boutaghou et al. | 360/294.3 |
| 6,610,556 B2 * | 8/2003 | Vigna et al. | 438/50 |
| 6,638,836 B1 * | 10/2003 | Murari et al. | 438/459 |
| 6,689,627 B2 * | 2/2004 | Mottura et al. | 438/24 |
| 6,798,953 B1 * | 9/2004 | Cohen et al. | 385/49 |
| 2001/0036683 A1 * | 11/2001 | Vigna et al. | 438/106 |
| 2001/0038148 A1 * | 11/2001 | Mastromatteo et al. | 257/758 |
| 2001/0040772 A1 * | 11/2001 | Murari et al. | 360/294.3 |
| 2002/0043728 A1 * | 4/2002 | Harada | 257/787 |
| 2002/0109419 A1 * | 8/2002 | Vigna et al. | 310/14 |
| 2002/0127761 A1 * | 9/2002 | Mottura et al. | 438/50 |
| 2002/0135062 A1 * | 9/2002 | Mastromatteo et al. | 257/723 |
| 2003/0047002 A1 * | 3/2003 | Arms et al. | 73/504.17 |
| 2003/0235013 A1 * | 12/2003 | Sarto et al. | 360/294.3 |

OTHER PUBLICATIONS

"HIPEC® Q1–4939 Semiconductor Protective Coating," *Dow Corning Corporation,* May 1, 1998.

"HIPEC® 1–9224 Semiconductor Protective Coating," *Dow Corning Corporation,* May 1, 1998.

"ECCOCOAT® S 5500 Two Component, Transparent, Silicone Gel," *Emerson & Cuming Specialty Polymers,* ©1997.

"XS 90069–2 Silicone Gel," *Emerson & Cuming Specialty Polymers,* ©1997.

* cited by examiner

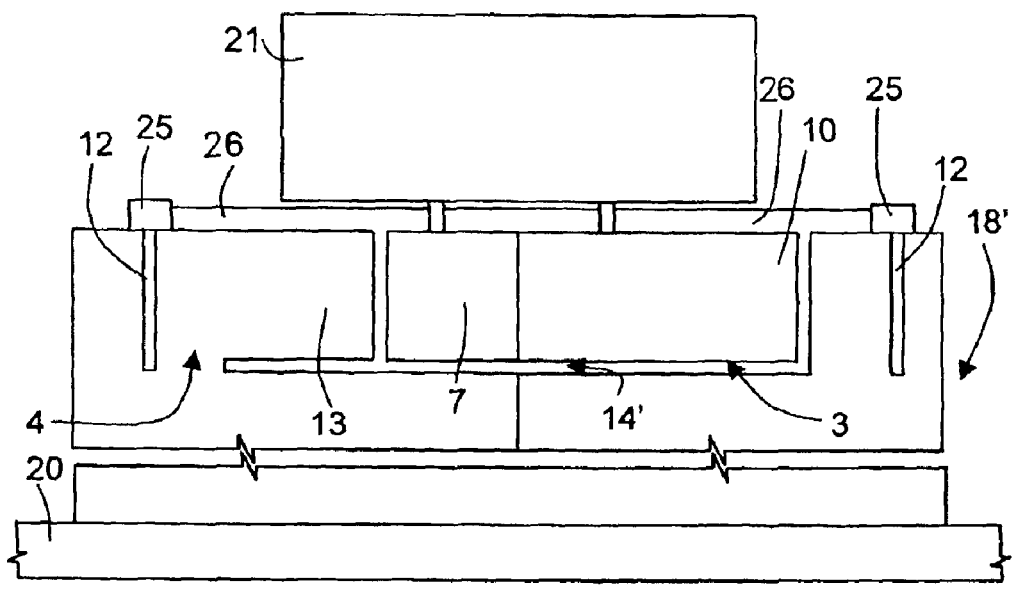
FIG. 9
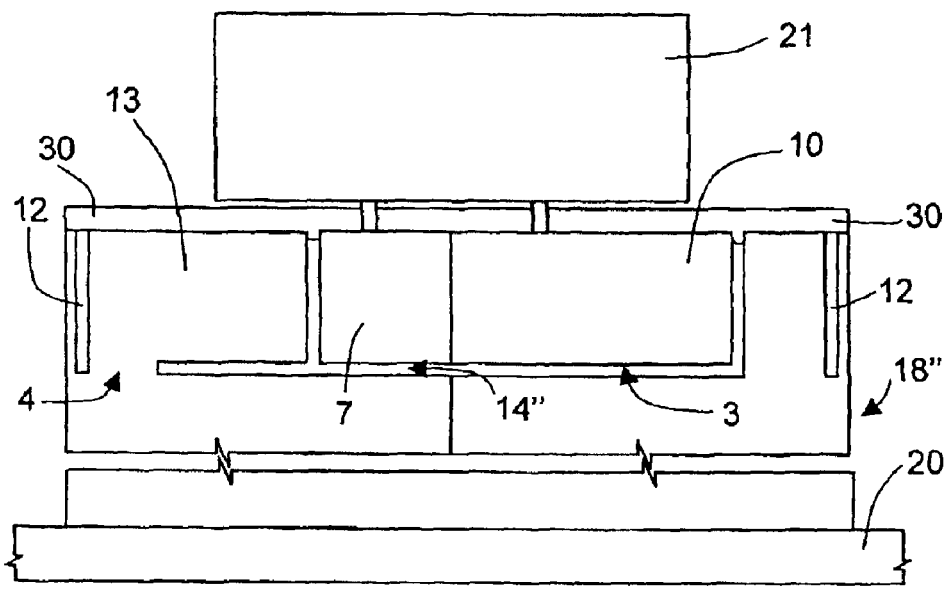
FIG. 10
FIG. 11

PROCESS FOR SEALING DEVICES INCORPORATING MICROSTRUCTURES

BACKGROUND OF THE INVENTION

1. Field of the Invention

The present invention relates to a process for sealing devices incorporating microstructures.

2. Description of the Related Art

As is known, the evolution of the techniques of micromachining of semiconductor materials, in particular silicon, has made it possible to obtain a wide range of devices based upon electromechanical structures having parts that are relatively mobile with respect to one another. By way of example, among said devices mention may be made of optical devices comprising tiltable micromirrors, micromotors, microactuators for fine positioning of read/write heads of magnetic disks, and sensors, such as pressure sensors and accelerometers both of a linear type and of a rotary type.

On the other hand, it is known that microelectromechanical structures, or microstructures, as they will be referred to hereinafter, are brittle and easily subject to mechanical failure, and consequently may be damaged both during fabrication and during use.

In particular, certain processing steps and subsequent steps of handling, transportation, assembly and use of the devices expose the microstructures to impurities that may penetrate between the moving parts and cause irreparable damages. For example, the step of cutting a semiconductor wafer comprising a plurality of devices in order to obtain dice each of which contains a single device is particularly critical. In fact, wafers are normally cut by means of a purely mechanical process, in which a saw cooled by a flow of water is used. Consequently, during the cutting operation a considerable amount of particles spread into the environment.

If the microstructure is not adequately protected either during the cutting step or during subsequent fabrication steps, dust, humidity or other contaminating agents may penetrate into the gaps that separate the relatively mobile parts of the microstructure itself. Clearly, the presence of external contaminating agents may cause a partial or total blockage or even failure of the microstructure.

To overcome the above mentioned problem, a known solution is encapsulating the microstructures in a protective structure before the wafer is cut. Normally, the protective structure comprises a second wafer of semiconductor material or of another material, such as glass, ceramics, or a plastic material, and is bonded on the wafer to be protected in such a way as to seal the gaps between the mobile parts, so rendering them inaccessible from outside. Once the wafer has been cut, each individual die comprises a respective portion of the protective structure, which in certain cases remains incorporated in the finished product, whereas in other cases it must be removed.

The above described solution, however, has some disadvantages. First, the use of a second semiconductor wafer or of a wafer made of another material for the sole purpose of sealing the microstructure involves a considerable cost. In the second place, the process is complex, since encapsulation requires numerous fabrication steps. For example, before bonding the wafer to be protected and the protective structure, it is necessary to prepare bonding areas; next, the protective structure must be removed or, alternatively, thinned out in order to reduce the overall dimensions of the finished device.

A further drawback is represented by the fact that the above mentioned solution can be effectively used only for certain types of devices, which, during use, can remain encapsulated (for instance, accelerometers). In other cases, instead, the microstructures interact directly with the outside environment and, consequently, the devices incorporating them must necessarily be opened during operation. For example, in microactuators for fine positioning of read/write heads of magnetic disks, the microstructure must enable the angular position of the head to be varied with respect to a supporting arm of a main actuator. For this purpose, a first part of the microstructure (stator) is fixed to the supporting arm, and a second part (rotor), which can turn with respect to the first part, is rigidly connected to the head. Precisely on account of the fact that in this case the function of the microactuator is to modify the positions of two bodies with respect to one another, clearly the microstructure must remain free and cannot be encapsulated. Likewise, also in optical devices provided with tiltable micromirrors, the microstructures, which must be reachable by the electromagnetic radiation coming from outside, cannot be encapsulated.

Hence, the processes according to the prior art are not suitable for protecting devices of the aforesaid type during their use. The said devices thus remain exposed to contaminating agents for a very prolonged period of time and, consequently, may easily get damaged.

BRIEF SUMMARY OF THE INVENTION

An embodiment of the present invention provides a process for sealing devices incorporating microstructures that is free from the drawbacks described above.

According to an embodiment of the present invention, a process for sealing devices that incorporate microstructures is provided, including the steps of forming, in a body of semiconductor material, a microstructure having a first portion and a second portion that are relatively movable with respect to one another and are separated from one another by a gap region, which is accessible through a face of said body, and sealing said gap region, said sealing step comprising closing said gap region by means of an elastomeric protective layer which enables a relative motion between said first portion and said second portion.

According to another embodiment of the invention, and a device includes a microstructure having a first portion and a second portion which are relatively movable with respect to one another and are separated from one another by a gap region, and an elastomeric sealing structure for protection of said microstructure, that closes said gap region and is made of a protective material that enables relative motion between said first portion and said second portion.

BRIEF DESCRIPTION OF THE SEVERAL VIEWS OF THE DRAWING(S)

For a better understanding of the present invention, a number of preferred embodiments thereof are now described, purely by way of non-limiting example, with reference to the attached drawings, in which:

FIG. 9 is a cross-section of the die obtained from the wafer of FIG. 8, in the operating configuration;

FIG. 10 is a cross-section of a semiconductor wafer incorporating a microstructure, in an initial step of a further embodiment of the process according to the present invention; and FIG. 11 is a cross-section of the die obtained from the wafer of FIG. 10, in the operating configuration.

DETAILED DESCRIPTION OF THE INVENTION

In the embodiments described hereinafter, the invention is used for protecting a microactuator for fine positioning of read/write heads of magnetic disks. This must not, however, be considered in any way limiting, and the invention can be exploited for protecting any type of device incorporating a microstructure.

Figure 1:
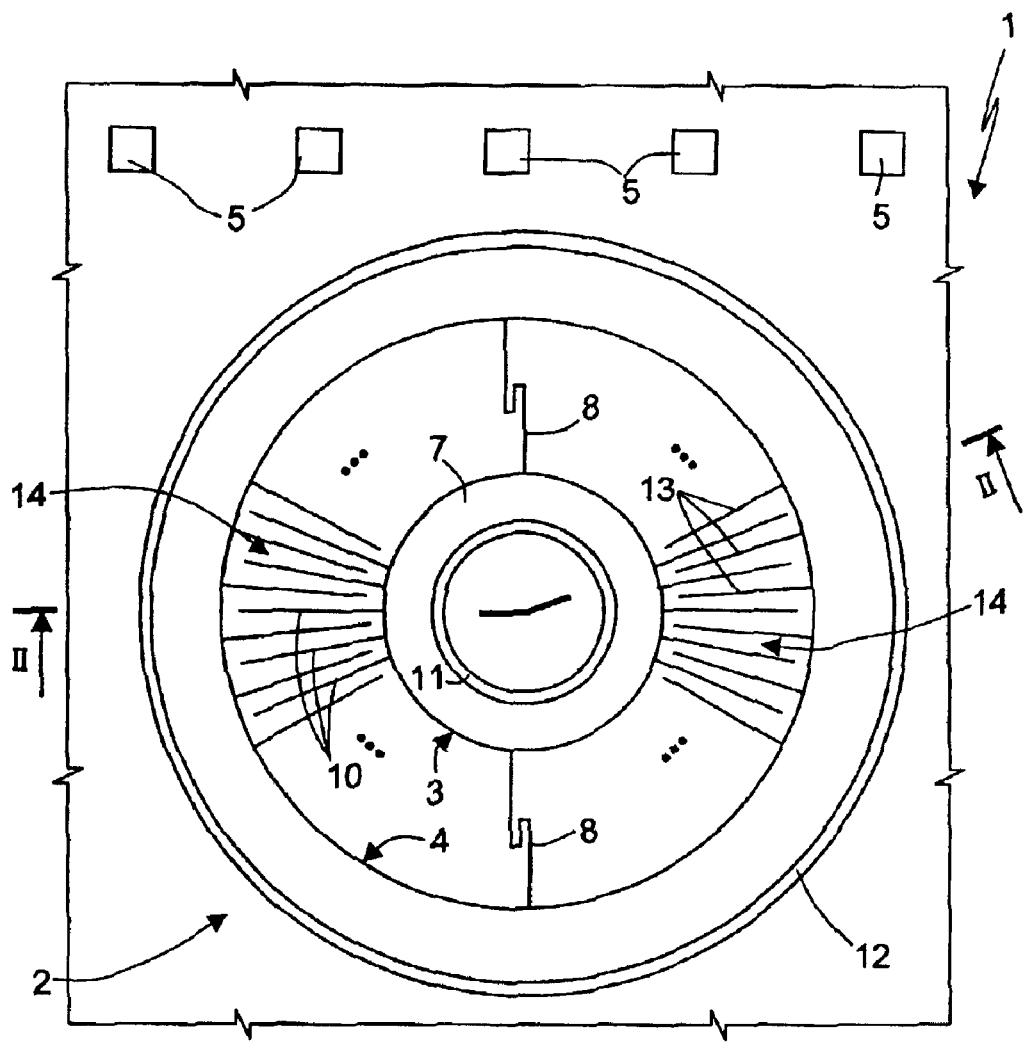
FIG. 1 is a top plan view of a semiconductor wafer incorporating a microstructure, in an initial step of a first embodiment of the process according to the present invention.
Figure 2:
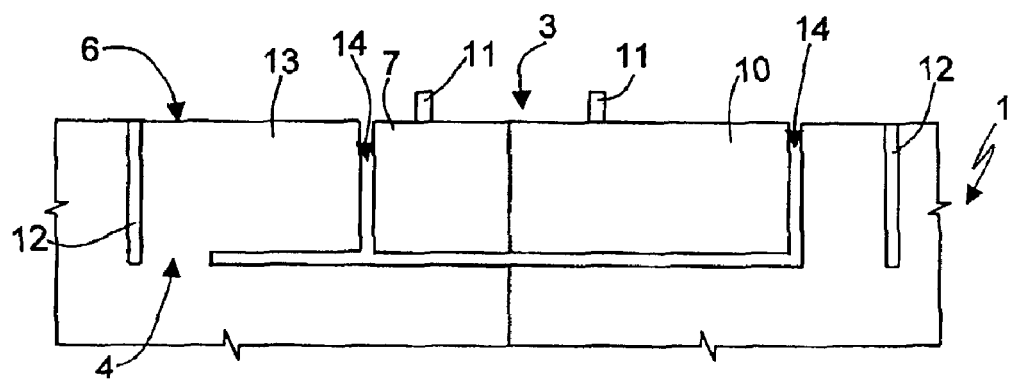
FIG. 2 is a side view of the wafer of FIG. 1, sectioned according to a line of trace II—II.

With reference to FIGS. 1 and 2, in a wafer 1 of semiconductor material, for example silicon, known fabrication steps for the fabrication of microstructures, in particular microactuators 2 (only one of which is here illustrated in a simplified way for reasons of convenience), are initially carried out.

The microactuator 2 comprises a rotor 3, a stator 4, and a plurality of electrical connection pads 5.

In greater detail, the rotor 3 comprises a suspended mass 7 and a plurality of rotor arms 10; the suspended mass 7 has a circular shape, is connected to the stator 4 and is angularly movable with respect to the latter through elastic elements 8; the plurality of rotor arms 10 extend from the suspended mass 7 radially outwards. In addition, a supporting ring 11, which is designed to be bonded to an R/W head (here not illustrated) in a subsequent fabrication step, is carried above the suspended mass 7 of the rotor 3.

The stator 4, which basically has an annular shape and is concentric with the suspended mass 7, is externally delimited by a trench 12 filled with dielectric material, such as silicon dioxide, and comprises a plurality of stator arms 13 which extend radially inwards. In particular, the rotor arms 10 and stator arms 11 are comb-fingered and coupled together in a capacitive way.

Furthermore, the rotor 3 and stator 4 are separated from one another by a gap region 14, which is initially empty and is accessible from outside through a face 6 of the wafer 1.

Figure 3:
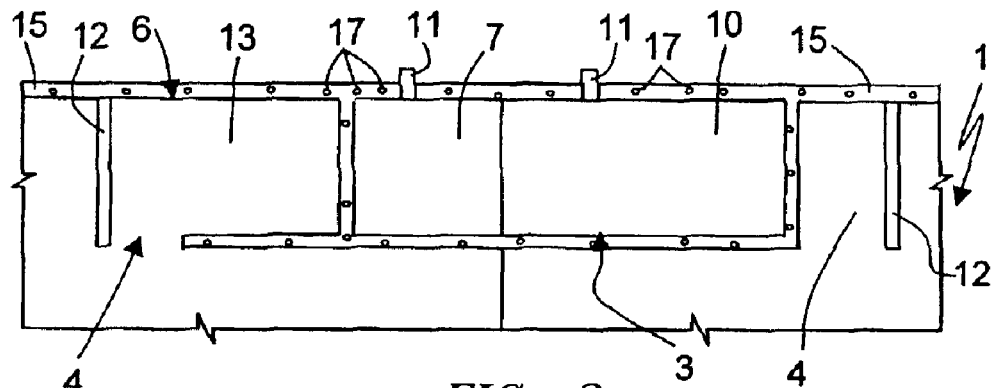
FIGS. 3 and 4 show the wafer of FIG. 2 in successive fabrication steps.

As shown in FIG. 3, a sealing layer 15 of a protective material is subsequently deposited on the face 6, so as to coat the wafer 1 entirely and close the gap region 14. In particular, the protective material is deposited in direct contact with the microactuator 2. Advantageously, the protective material used is a dielectric material having a viscosity lower than a first threshold, equal to approximately 180 mPa·s, and a hardness lower than a second threshold, approximately equal to 30 points on the Shore A scale (measurement performed in accordance with the ASTM-D2240 Standard). More specifically, in the embodiment here described, an elastomeric material is used, preferably a silicone material, in the gel state and having a viscosity of between 4.5 and 7.6 mPa·s and a hardness such as to have a gel penetration value of between 40 and 70 tenths of a millimeter (4–7 mm). In this case, a particularly soft material is used, and the Shore A scale is not suited to detecting the hardness value thereof. This measurement is therefore carried out according to the Corporate Test Method CTM 0155 Standard of Dow Corning.

Thanks to its low viscosity, the protective material of the sealing layer 15 penetrates the gap region 14, filling it completely. In addition, the protective layer does not substantially modify the relative movement of the rotor 3 and with respect to the stator 4, in so far as it also has a high degree of elasticity. In fact, the said relative movement is of a damped oscillatory type and, in practice, the protective material that fills the gap region 14 determines only a modest increase in damping as compared to the case in which air is present in the gap region 14.

Figure 4:
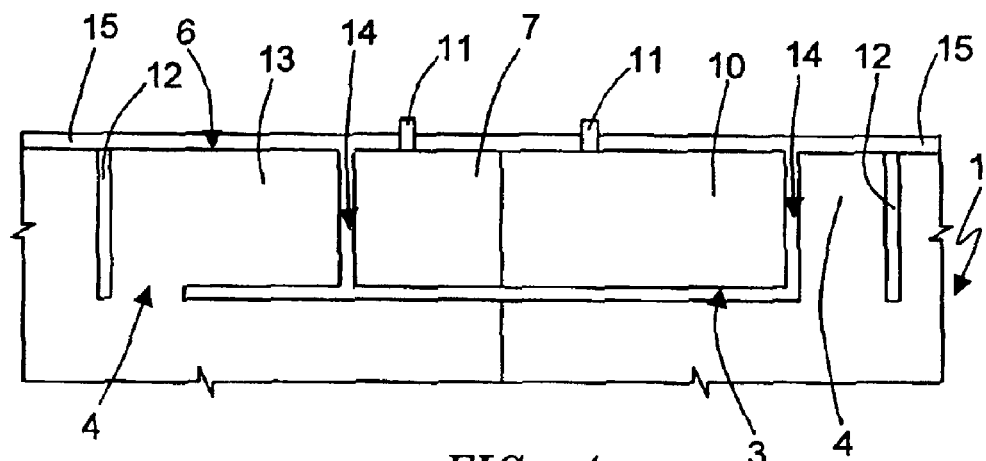

During the deposition of the protective material, air bubbles 17, may form inside the sealing layer 15 and must be eliminated. For this purpose, the wafer 1 is placed in a low pressure environment for a first preset time interval; for example, the pressure is reduced to a value of approximately 10–20 mmHg for 30 minutes. In this way, the air bubbles 17 burst, and the protective material forming the sealing layer 15 assumes a more homogeneous distribution (FIG. 4).

In order to stabilize the mechanical and electrical characteristics of the protective material forming the sealing layer 15, a crosslinking polymerization ("curing") step is then performed, in which the wafer 1 is heated for a second preset time interval (for example, the wafer 1 is brought to a temperature of approximately 150° C. for 60 minutes).

Figure 5:
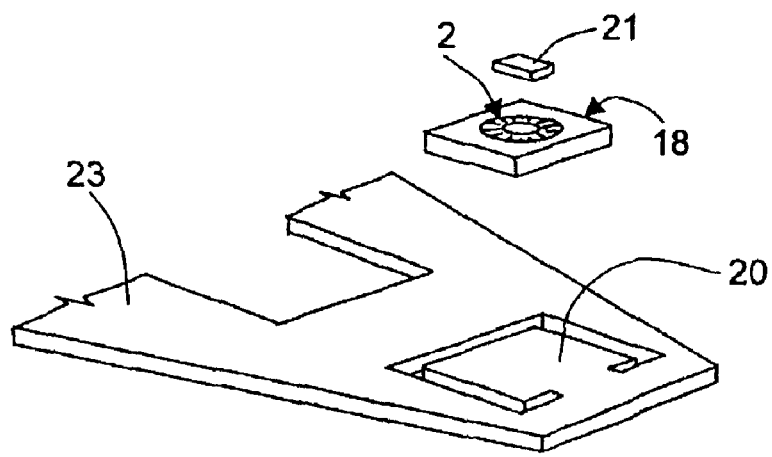
FIG. 5 is an exploded perspective view of a portion of an actuator including a die obtained from the wafer of FIG. 4.
Figure 6:
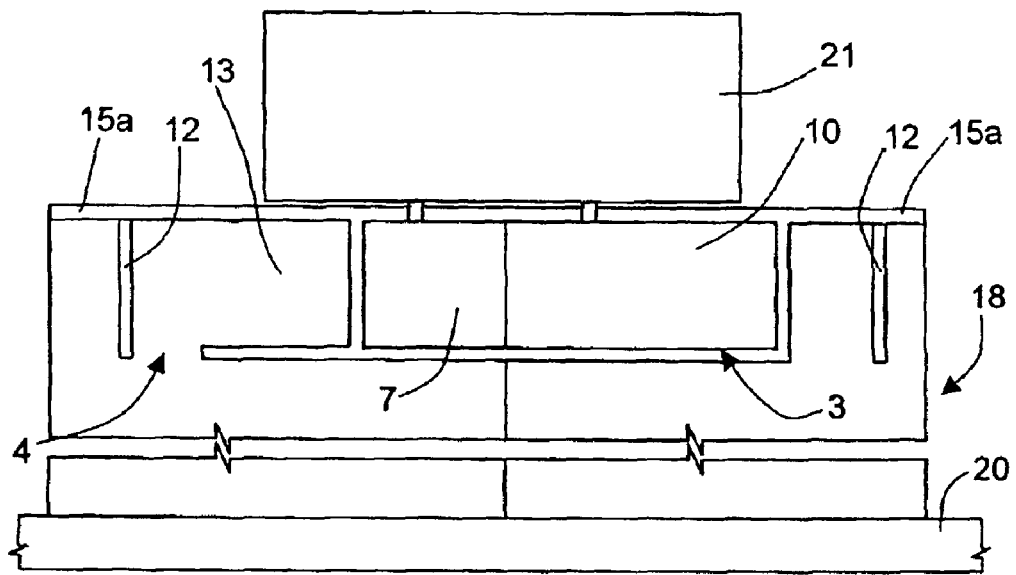
FIG. 6 is a cross-sectional view of the die of FIG. 5, in the operating configuration.

Subsequently, the wafer 1 is cut, employing the usual cutting techniques, and is divided into a plurality of dice 18, each of which contains a single microactuator 2 and a respective portion 15a of the sealing layer 15 (FIGS. 5 and 6). The protective material adheres in fact to the silicon of the wafer 1 and does not detach therefrom. In this step, then, each microactuator 2 is protected both from the dust produced during cutting of the wafer 1 and from the water used for cooling the saw.

Next, the final steps for assembling the die 18 are carried out. In particular, the die 18 is bonded on a gimbal 20 of an actuator 23 for the positioning of R/W heads (for reasons of simplicity, the actuator 23 is here shown only in part). An R/W head 21 is bonded on the supporting ring 11 carried by the moving mass 7 of the rotor 3; and wire connections are made between the pads 5 and contacts (here not illustrated) prepared on the gimbal 20.

The advantages of the present invention emerge clearly from the above description. First of all, devices obtained by means of the process described are validly protected from intrusion of contaminating agents not only during fabrication, but also during normal operation, since the protective material inserted into the gaps of the microstructure is not removed. This is advantageous above all in the case of devices that, precisely as in the case of microactuators, cannot be completely encapsulated in a rigid protective structure because they must interact directly with external bodies. The process is also simpler and less costly.

In the specific case of the microactuator 2, moreover, the use of a protective material which has the mechanical properties described above (low viscosity and low modulus of elasticity) results in a faster damping of the oscillating movement of the rotor 3 with respect to the stator 4, and consequently control of the microactuator 2 itself is less critical.

Figure 6A:
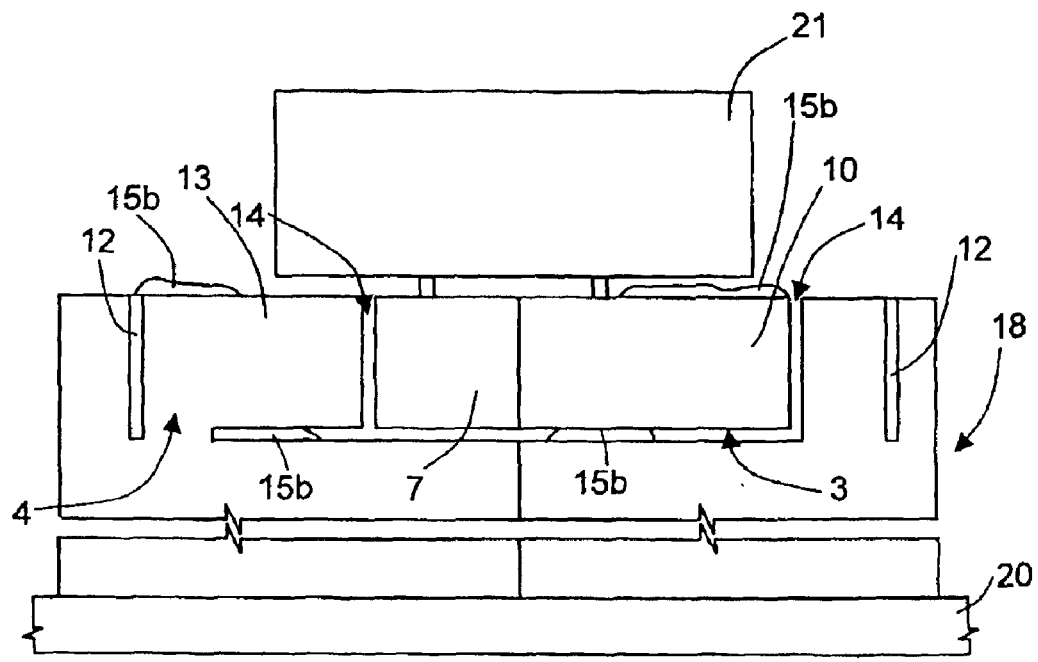
FIG. 6A is a cross-section of a die incorporating a microstructure, obtained according to a variant of the present invention.

According to a different embodiment of the process described, after the wafer 1 has been cut, the sealing layer 15a that coats each die 18 is removed either mechanically or chemically. In this case (FIG. 6A), residual portions 15b of protective material remain both on the die 18 and around the gap region 14. The die 18 is then assembled on the gimbal 20 and on the R/W head 21, so as to obtain the structure shown in FIG. 6A.

The embodiment illustrated can be used, for example, in the case of devices designed to operate in environments substantially free from contaminating agents. These devices, during use, can be left free, but must in any case be protected during some of the fabrication steps.

Figure 7:
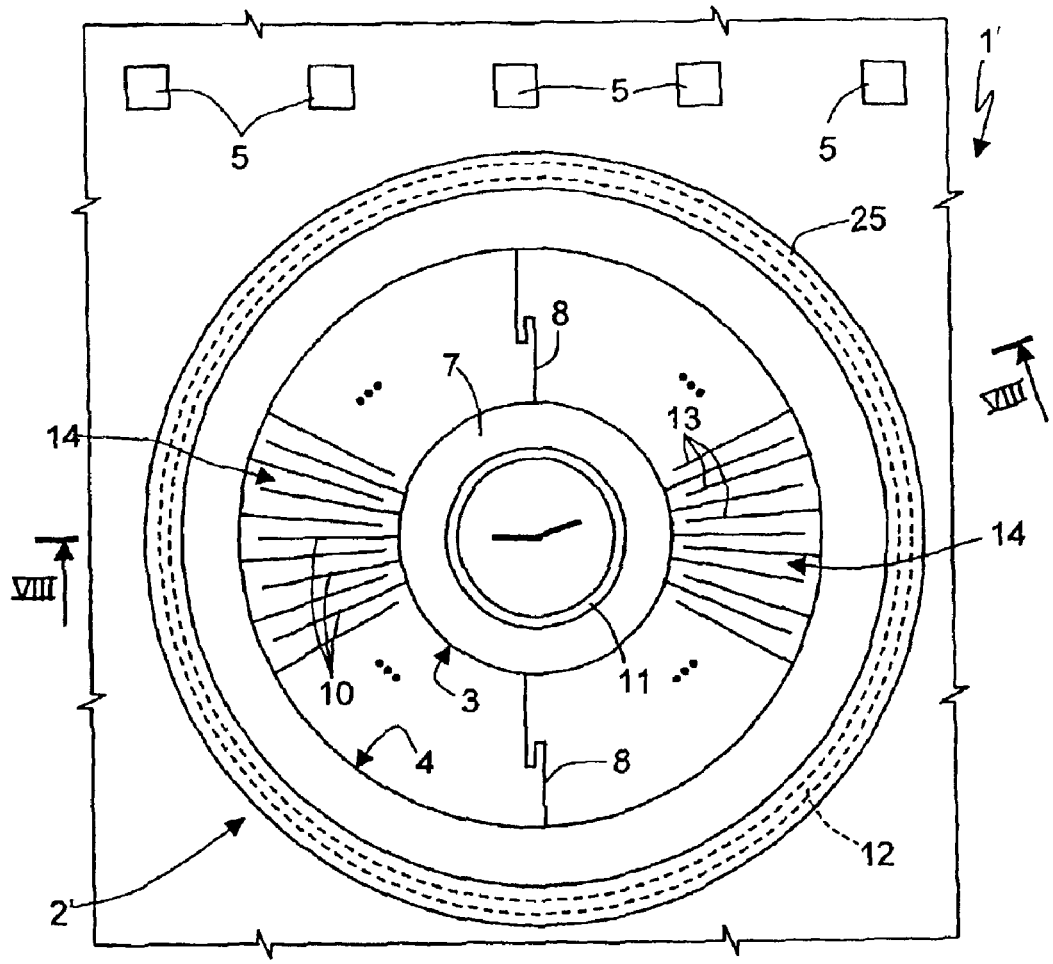
FIG. 7 is a top plan view of a device incorporating a microstructure, in an initial step of a different embodiment of the process according to the present invention.
Figure 8:
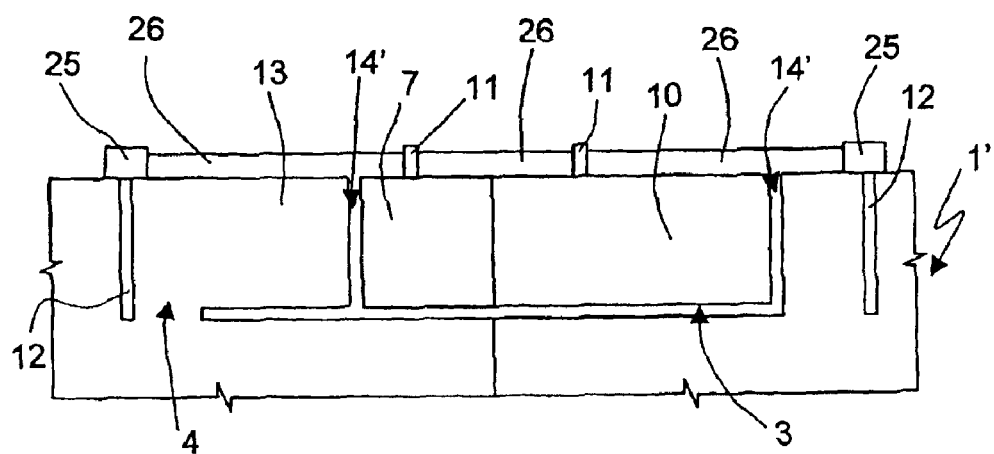
FIG. 8 is a side view of the wafer of FIG. 7, sectioned according to a line of trace VIII—VIII.

A different embodiment of the invention will described hereinafter with reference to FIGS. 7–9, in which parts that are the same as those already shown are designated by the same reference numbers. As shown in FIG. 7, in which for reasons of convenience only one microactuator 2 is illustrated, microactuators 2' are initially fabricated in the wafer 1', each microactuator being surrounded by a respective resist containment ring 25 projecting from the face 6 of the wafer 1' (FIG. 8). In this case, in particular, the containment ring 25 overlies the trench 12.

Next (FIG. 8), a sealing region 26 is formed by selectively depositing, within the containment ring 25, a protective material basically having the same mechanical properties (viscosity and modulus of elasticity) as those described previously for the sealing layer 15 of FIG. 3. Consequently, the protective material forming the sealing region 26 penetrates into the gap region 14' between the rotor 3 and the stator 4, filling it completely, and remains confined within the containment ring 25. Consequently, the portion of the surface of the wafer 1' outside the containment ring 25 and, in particular, the pads 5 remain free.

The process is then completed with the steps previously described. In particular, any air bubbles that may be present in the sealing region 26 are eliminated, and the protective material forming the sealing region 26 is stabilized by means of a crosslinking polymerization step. The wafer 1' is then cut in such a way as to obtain a plurality of dice 18', each of which contains a microactuator 2' and a respective sealing region 26. Each die 18' is bonded on a gimbal 20, and then an R/W head 21 is bonded on the supporting ring 11, and wire connections are made between the pads 5 and contacts (here not illustrated) prepared on the gimbal 20. The structure shown in FIG. 9 is thus obtained.

According to a further embodiment of the present invention, which is shown in FIGS. 10 and 11, initially a wafer 1" of semiconductor material, comprising a plurality of microactuators 2" of the type already described with reference to FIG. 1, is prepared.

Subsequently, a sealing layer 30 (FIG. 10) is deposited on the face 6 of the wafer 1" so as to coat it completely; in particular, the sealing layer 30 is deposited in direct contact with the microactuator 2". The sealing layer 30 is here made of a protective material having a viscosity of between 800 and 1800 mPa·s and a hardness of less than 30 points on the Shore A scale. In addition, the hardness of the protective material must be such that the gel penetration value is less than 33 tenths of a millimeter (3.3 mm), according to the aforesaid CTM 0155 Standard.

For example, a silicone gel can be used. In this case, the protective material forming the sealing layer 30 closes access to the gap region 14" between the rotor 3 and the stator 4, thus preventing intrusion of contaminating agents; however, the protective material has a viscosity and a surface tension higher than in the examples previously described and, in particular, such that the gap region 14" is not filled.

The process is then completed with the steps already illustrated. In particular, any air bubbles that may be present in the sealing layer 30 are eliminated. A crosslinking polymerization step is performed. The wafer 1" is cut and divided into dice 18", each of which comprises a single microactuator 2" and a respective portion 30a of the sealing layer 30. Each die 18" thus obtained is bonded to a respective gimbal 20 and to a respective R/W head 21. Finally, wire connections are made between the pads 5 and contacts (here not illustrated) prepared on the gimbal 20. The structure shown in FIG. 11 is thus obtained.

Finally, it is clear that modifications and variations may be made to the process described herein, without thereby departing from the scope of the present invention.

In the first place, the process can be used for protecting devices that integrate microstructures of any type, such as microactuators and micromotors having geometries different from the one described, and sensors such as accelerometers or pressure sensors. In addition, given that silicone gels are substantially transparent, the process can be used also in the case of optical devices, such as devices provided with tiltable micromirrors.

Second, the sealing layer that coats the wafer in which the microstructure is fabricated can be made of a different material, for example an oil.

At times the microstructures fabricated inside the wafer can have a conformation such as not to require any special protection during cutting of the wafer itself, but must in any case be sealed before use, for example because they are designed to operate in an unfavorable environment. In these cases, the protective layer may be deposited locally on the individual die after cutting the wafer and before the final assembly steps.

Furthermore, the crosslinking polymerization step may be absent.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. A process for the sealing of devices that integrate microstructures, comprising:

forming, in a body of semiconductor material, a microstructure having a first portion and a second portion, which are relatively movable with respect to one another and are separated from one another by a gap region, which is accessible through a face of said body; and sealing said gap region, by closing said gap region by means of a protective layer which enables a relative motion between said first portion and said second portion.

2. The process according to claim 1, wherein said step of closing comprises depositing, on said face of said body, said protective layer in direct contact with said microstructure.

3. The process according to claim 1 wherein said protective layer is made of a material having a viscosity of less than 1800 mPa·s and a hardness of less than 30 points on the Shore A scale.

4. The process according to claim 1 wherein said step of closing comprises filling completely said gap region with said protective layer.

5. The process according to claim 4, wherein said protective layer has a viscosity of between 4.5 and 7.5 mPa·s.

6. The process according to claim 4 wherein said protective layer has a gel penetration value of between 40 and 70 tenths of a millimeter.

7. The process according to claim 1 wherein said protective layer has a viscosity of between 800 and 1800 mPa·s.

8. The process according to claim 7 wherein said protective layer has a hardness of less than 30 points on the Shore A scale and a gel penetration value of less than 33 tenths of a millimeter.

9. The process according to claim 1 wherein said protective layer is made of an elastomeric material in the gel state.

10. The process according to claim 9 wherein said protective layer is made of a silicone elastomeric material.

11. The process according to claim 1 wherein said step of forming comprises the step of making a containment structure projecting from said face and surrounding said microstructure; and said step of sealing comprises selectively depositing said protective layer inside said containment structure.

12. The process according to claim 1 wherein said closing step is followed by the step of cutting said body into a plurality of dice, each of which comprises a single microstructure.

13. A micro-electromechanical device, comprising:
a microstructure having a first portion and a second portion which are relatively movable with respect to one another and are separated from one another by a gap region; and
a sealing structure that closes said gap region and is made of a material that enables relative motion between said first portion and said second portion.

14. The device according to claim 13, wherein said sealing structure is in direct contact with said microstructure.

15. The device according to claim 13 wherein said protective material has a viscosity of less than 1800 mPa·s and a hardness of less than 30 points on the Shore A scale.

16. The device according to claim 15 wherein said viscosity value is between 800 and 1800 mPa·s.

17. The device according to claim 16 wherein said protective material has a hardness of less than 30 points on the Shore A scale and a gel penetration value of less than 33 tenths of a millimeter.

18. The device according to claim 13 wherein said gap region is completely filled with said protective material.

19. The device according to claim 18 wherein said viscosity value is between 4.5 and 7.5 mPa·s.

20. The device according to claim 18 wherein said protective material has a gel penetration value of between 40 and 70 tenths of a millimeter.

21. The device according to claim 13 wherein said protective material is an elastomeric material in the gel state.

22. The device according to claim 21 wherein said protective material is a silicone elastomeric material.

23. The device of claim 13 wherein said sealing structure is configured to protect said microstructure and is made of a protective material that enables relative motion between said first portion and said second portion.

24. The device according to claim 13 wherein said protective material has a viscosity of less than approximately 180 mPa·s.

25. The device of claim 13 wherein the sealing structure is an elastomeric material.

26. The device of claim 13 wherein the sealing structure is formed from oil.

27. A micromechanical device, comprising:
a stator formed in a semiconductor material body;
a rotor formed in the semiconductor material body, separated from the stator by a gap and movable with respect to the stator; and
an elastomeric seal closing the gap.

28. The device of claim 27 wherein the elastomeric seal fills the gap.

29. The device of claim 27 wherein the elastomeric seal bridges the gap between the stator and the rotor without occupying the gap, per se.

30. The device of claim 27 wherein the rotor is fully encapsulated.

31. A method, comprising:
forming, in a semiconductor material body, a micromechanical structure, moveable with respect to the body, and separated therefrom by a gap;
filling the gap with an elastomeric material; and
cutting, from the semiconductor material body, a segment of the body comprising the micromechanical structure, the gap, and a portion of the body surrounding the structure.

32. The method of claim 31, further comprising removing the elastomeric material from the gap.

33. A method, comprising:
forming, in a semiconductor material body, a micromechanical structure, moveable with respect to the body, and separated therefrom by a gap;
bridging the gap with an elastomeric material such that the gap is sealed without introducing elastomeric material into the gap; and
cutting, from the semiconductor material body, a segment of the body comprising the micromechanical structure, the gap, and a portion of the body surrounding the structure.

34. A method, comprising:
moving a first structure formed in a semiconductor device relative to a second structure formed in the semiconductor device, the first structure being separated from the second structure by a gap, and the gap being closed by a material in contact with both the first and second structures, the material having a degree of resiliency sufficient to permit the relative movement.

35. The method of claim 34, further comprising preventing contaminants from entering the gap, the preventing step being performed by the material.

36. The method of claim 34, further comprising damping the relative movement, the damping step being performed by the material.

37. The method of claim 34 wherein the first and second structures comprise parts of a device selected from among a microactuator, a micromotor, an accelerometer, and a pressure sensor.

38. The method of claim 34 wherein the first and second structures are at least partially exposed to a surrounding environment.

39. The method of claim 34 wherein the first structure is fully encapsulated.

40. A device, comprising:
   a first structure formed in a semiconductor device;
   a second structure formed in the semiconductor device, which is movable with respect to the first structure and separated therefrom by a gap; and
   sealing means for closing the gap while permitting movement of the second structure relative to the first structure.

41. The device of claim 40 wherein the sealing means includes an elastomeric seal in contact with upper surfaces of the first and second structures on opposite sides of the gap.

42. The device of claim 40 wherein the sealing means includes an elastomeric seal positioned within the gap and in contact with surfaces of the first and second structures substantially facing each other within the gap.

* * * * *